United States Patent [19]
Preston

[11] Patent Number: 5,938,779
[45] Date of Patent: Aug. 17, 1999

[54] ASIC CONTROL AND DATA RETRIEVAL METHOD AND APPARATUS HAVING AN INTERNAL COLLATERAL TEST INTERFACE FUNCTION

[75] Inventor: James M. Preston, Raleigh, N.C.

[73] Assignee: Alcatel Alsthom Compagnie Generale d'Electricite, Paris, France

[21] Appl. No.: 08/805,661

[22] Filed: Feb. 27, 1997

[51] Int. Cl.⁶ .......................... G01R 31/28; G11C 29/00
[52] U.S. Cl. .................. 714/718; 714/727; 714/733; 714/734; 714/724
[58] Field of Search ................................. 714/718, 724, 714/727, 733, 734

[56] References Cited

U.S. PATENT DOCUMENTS

| | | | |
|---|---|---|---|
| 4,701,870 | 10/1987 | Mogi et al. ............................. | 364/580 |
| 4,811,344 | 3/1989 | Chaurel et al. ........................ | 371/22.1 |
| 4,969,148 | 11/1990 | Nadeau-Dostie et al. ............. | 371/22.1 |
| 4,989,209 | 1/1991 | Littlebury et al. .................... | 371/22.1 |
| 5,043,986 | 8/1991 | Agrawal et al. ....................... | 371/25.1 |
| 5,130,988 | 7/1992 | Wilcox et al. ......................... | 371/22.3 |
| 5,515,382 | 5/1996 | Lassorie ................................ | 371/22.3 |
| 5,623,503 | 4/1997 | Rutkowski ............................. | 371/22.3 |
| 5,638,380 | 6/1997 | De .......................................... | 371/22.3 |
| 5,644,580 | 7/1997 | Champlin .............................. | 371/22.5 |
| 5,701,309 | 12/1997 | Gearhardt et al. ..................... | 371/25.1 |

OTHER PUBLICATIONS

"Functional Level, Concurrent Fault Simulation", L. Henckels et 25th Anniversary Compendium of Papers from Int'l Test Conf, IEEE CS Press 1994, pp. 253–259.

"Real–Time On–Board Bus Testing", J. Floyd et al, Proc. 13th IE VLSI Test Symp., IEEE CS Press, 1995, pp. 140–145.

"IEEE Standard Test Access Port and Boundary–Scan Architecture" IEEE Std. 1149.1–1990, pub. IEEE, Inc. NY Oct. 21, 1993.

"Transition Fault Simulation by Parallel Pattern Single Fault Propagation", J. Waicukauski et al, Proc. Int'l Test Conf., IEEE 1986, pp. 542–549; reprinted 1986 by IEEE, pp. 260–267.

"Built–In Test for Complex Digital Integrated Circuits", B.Koenmann et al, *IEEE Journal of Solid State Circuits*, vol. SC–15, No. 3, Jun. 1980, pp. 315–319.

*Primary Examiner*—Hoa T. Nguyen
*Attorney, Agent, or Firm*—Ware, Fressola, Van Der Sluys & Adolphson LLP

[57] ABSTRACT

ASIC (Application-Specific Integrated Circuit) testability, troubleshooting access and visibility of internal circuitry are the primary targets of test engineering analysis. The widely applied boundary-scan technique is a useful interface but does not solve all problems connected with the PBA (Printed Board Assembly) manufacturing process. The invention provides an extension of the boundary-scan technique currently implemented to provide improved ASIC testability. The Collateral ASIC Test (method and logic) implemented in a boundary-scan device according to the invention makes possible a test process standardization to ASIC design and testing.

12 Claims, 10 Drawing Sheets

5,938,779

ASIC CONTROL AND DATA RETRIEVAL METHOD AND APPARATUS HAVING AN INTERNAL COLLATERAL TEST INTERFACE FUNCTION

BACKGROUND OF THE INVENTION

1. Technical Field

The present invention relates to application specific integrated circuits (ASICs) and, more particularly, to testing thereof.

2. Description of Related Art

Most manufactured electronic PBAs are designed primarily using off-the-shelf ICs and the ASICs. Therefore, the current PBA test philosophy is based on board-level-test techniques. See Colin M. Maunder, Rodham E. Tullos, "The Test Access Port and Boundary-Scan Architecture". IEEE Computer Society Press, Los Alamitos, Calif. 1990. However, an increasing number of ASIC applications gives us the opportunity to utilize new methods in manufacturing test processes. One of these methods is a boundary-scan test method. See J. A. Waicukauski, E. Lindbloom, B. Rosen, V. Iyengrar, "Transition Fault Simulation by Parallel Pattern Single Fault Propagation", International Test Conference 1994 Proceedings, "TEST: The Next 25 Years" pp. 253–259, International Test Conference 205 Tennyson Ave, Suite C Altoona, Pa. 16602. Published in 1994.

The Boundary-Scan technique and technology defined by IEEE Std 1149.1a-1993 "IEEE Standard Test Access Port and Boundary-Scan Architecture", IEEE Std 1149.1a-1993, Institute of Electrical and Electronics Engineers, Inc. approved Jun. 17, 1993, published Oct. 21,1993, N.Y., USA describes the test logic implementation for integrated circuits (IC) to provide standardized test of ICs as they interact in an assembled product. The overall block Diagram of IEEE Std 1149.1a-1993 boundary-scan architecture at the component level is shown in FIG. 1.

The signals shown are standard inputs and outputs:

TCK (test clock)—the clock used to drive the TAP controller and boundary scan circuitry.

TDI (test data in)—the input for a serialized instruction or test data. Data at TDI is clocked in on the rising edge of TCK.

TDO (test data out)—the output for a serialized test data. Data is clocked out at TDO on the falling edge of TCK.

TMS (test mode select)—this input provides a means to control the BSCAN TAP controller. The TMS state is sampled on the rising edge of TCK.

TRST (test reset)—this optional input is an asynchronous reset of the TAP controller.

Internal data is captured and transmitted by setting up specific instructions with corresponding data registers to access and retrieve data. FIG. 2 is a diagram of the state machine employed by the BSCAN interface which allows instructions and data to be shifted into, and data to be shifted out of, the device under test.

The boundary scan architecture and state machine as shown in FIGS. 1 and 2 are imbedded in a BSCAN interface (BSCAN) as shown in an ASIC under test in FIG. 3 of the prior art. A standardized test interface to this boundary scan architecture includes a BSCAN control and an interface to a test set controller with a vector signal line (vector) referring to the test control language, a general-purpose interface bus (GPIB), a VME extension for an instrumentation bus (VXI) and a standard serial link (RS-232). The test set controller sends and receives data signals to and from the ASIC under test to verify proper functionality. The test set controller is designed specially for the ASIC to be tested via the pins under test line of FIG. 3. The design of such a test set controller is quite expensive.

The Standard permits "Private Instructions". Private Instructions allow the use of Test Access Port (TAP) and test logic to gain access to test features embedded in the design for design verification, production testing, or fault diagnosis (IEEE Std 1149.1a-1993, par. 7.3).

The RUNBIST Instruction permits all components to execute their self-test concurrently, providing rapid test of assembled boards (IEEE Std 1149.1a-1993, par. 7.9).

The Standard permits the use of the Built In Logic Block Observer (BILBO)—a shift register based structure used in some forms of self-testing circuit design. B. Koenemann, J. Mucha, G. Zweihoff, "Built-in Test for Complex Digital Integrated Circuits", IEEE J. Solid-State Circuits, Vol. SC-15, No. 3, pp. 315–318.

The Boundary-Scan Register may have parallel input and output cells. These inputs/outputs may also be connected to the internal logic (IEEE Std 1149.1a-1993, par. 10).

The Collateral ASIC Test subordinates all of its functions to and is in compliance with the IEEE Std.1149.1a-1993 above restrictions and/or recommendations.

Unfortunately, this test method has several shortcomings: (a) limited circuit visibility, (b) low test frequency, and (c) artificial circuit stimulation. J. A. Waicukauski, E. Lindbloom, B. Rosen, V. Iyengrar, "Transition Fault Simulation by Parallel Pattern Single Fault Propagation", *International Test Conference* 1994 *Proceedings*, "TEST: The Next 25 Years" pp. 253–259, International Test Conference 205 Tennyson Ave, Suite C, Altoona, Pa. 16602. Published in 1994. Isolating faults to particular ASICs becomes a major obstacle in the troubleshooting of defective Printed Board Assemblies (PBAs). Present testing techniques do not address the problems associated with testing large complex circuits containing synchronous, sequential logic. The long frames of high speed serial data required to test and control circuits of this nature are difficult to simulate or detect using present testing techniques and commercial test equipment.

For example, bytes of information can exist embedded in a design, which may be accessible only through slow, complex, and proprietary interfaces which may automatically dispense this information at regular intervals. This arrangement becomes a virtual roadblock to the present test methodology, which has little control over the acquisition of needed test information from the device. A way to circumvent this interface in order to retrieve information in a timely matter is required.

Presently, the leading role in circuit implementation is taken by the ASIC. Although the use of ASICs has been widely accepted in the electronics industry, the advancement of this technology has not focused enough on ASIC testability. One aspect of improved ASIC testability is described below.

SUMMARY OF THE INVENTION

An object of the present invention is to improve ASIC testability.

An application specific integrated circuit (ASIC) including a standard boundary scan (BSCAN) interface, according to a first aspect of the present invention, further comprises a collateral test interface connected to said BSCAN interface by a signal line for exchanging information and connected to a memory device for storing information therein or for retrieving information therefrom.

In further accord with this first aspect of the present invention, the memory device may comprise a fault insertion register connected to the collateral test interface by a fault insertion information signal line. On the other hand, it may include another type of memory device instead, such as a status memory or a provisioning memory connected to the collateral test interface via control logic. Or, a selected combination of such different memory devices may be implemented.

According to a second aspect of the present invention, an application specific integrated circuit (ASIC) including a standard boundary scan (BSCAN) interface and a provisioning/status interface with control logic for storing provisioning data and/or for retrieving stored status data, is characterized by a collateral test interface for connection to said control logic and for alternative connection to:

(i) said provisioning/status interface for normal usage, and (ii) said BSCAN interface for testing usage, for storing said provisioning data and/or for retrieving said stored status data.

In further accord with the second aspect of the present invention, the ASIC is further characterized by a fault insertion register for connection to said BSCAN interface for storing fault insertion data therefrom.

According to a third aspect of the present invention, a method for testing an application specific integrated circuit (ASIC) that includes a standard boundary scan (BSCAN) interface and a provisioning/status interface with control logic for storing provisioning data and/or for retrieving stored status data, is characterized by alternatively connecting said control logic to said provisioning/status interface for normal usage and to said standard BSCAN interface for test usage, for storing said provisioning data and for retrieving said stored status data.

In further accord with this second aspect of the present invention, the method is further characterized by connecting said BSCAN interface to a fault insertion register for storing fault insertion data therefrom.

The Collateral ASIC Test Technique is an extension of the IEEE 1149.1a-1993 Standard. The name of Collateral Test was chosen to emphasize its parallel connection to the already defined IEEE boundary-scan architecture. The principal concept of the Collateral Test technique involves closely coupling the test logic to selected registers of the ASIC's Internal Logic. Collateral ASIC Test circuitry permits both control and status identification of internal logic but with a unique frequency (usually lower than the frequency of the ASICs Internal Logic). Such tactics will allow an application of lower frequency test data (not synchronous with the frequency of internal logic) to test the functionality of units which utilize high speed, serial synchronized signal processing. This also simplifies the test arrangement and allow development of a standard interface for ASIC (or product) control, configuration and status retrieval.

Implementation of the Collateral ASIC Test of the present invention is linked with several changes in approach to ASIC design. The ASIC's internal logic is expanded by selected parallel registers which allow communication between Boundary Scan (BSCAN) test circuitry and the ASIC's internal logic. Selected internal registers are designed as serial-parallel registers accessible and controllable from the BSCAN Interface. This design methodology is possible using present day technology, which allows for the design of ASICs with 50k gates (or more) with very flexible circuit application. These aspects will be described in detail below.

Implementation of the Collateral ASIC Test of the present invention brings several advantages, for instance internal ASIC logic visibility and, unlike the prior art ASIC test setup of FIG. 3, a simple one port communication with the ASIC under test. This Collateral ASIC Test technique also provides the possibility of designing a software fault implementation scheme for testing ASIC reactions and functionality under stress circumstances. Software fault implementation is accomplished by disabling internal ASIC registers or nodes without electrically affecting the remainder of the unit and without software intervention. See L. P. Henckels, K. M. Brown, C. Lo "Functional Level, Concurrent Fault Simulation", International Test Conference 1994 Proceedings, "TEST: The Next 25 Years" pp. 253–259, International Test Conference 205 Tennyson Ave, Suite C, Altoona, Pa. 16602. Published in 1994.

The BSCAN Interface combined with the collateral test methodology, according to the present invention, provides a standard means for controlling specific internal nodes in an ASIC that would otherwise be inaccessible. A Collateral Test Interface (CTI) is designed into the ASIC, which becomes the gateway into these internal nodes via the existing BSCAN port. Making use of BSCAN interface provides test with a familiar, existing method of communication with the device under test. With the Collateral Test three areas of improvements are seen:

1. PBA test cost and development time reduced,
2. PBA resident ASIC functional tests can be easily performed, and
3. Regression testing of Fault isolation for software verification can be easily performed.

PBA Test Costs

It was noticed during an examination of Assignee's manufactured product mix that there was a variety of PBAs. Each variety of PBA required the same parameters to be measured. The difference in the test set design is largely in the design of the communication channel required to configure each PBA, or Unit Under Test (UUT). It was apparent that, if a common method of communication with each PBA could be found, then the variety of test sets being developed could be reduced. The reduction of test set variety has a positive effect on capital expenditures, test set development and manpower requirements.

Assignee currently uses two internally standardized methods of communication with the UUT: the Serial Access Link for Test (SALT) and the Microcontroller Serial Interface (MSI). SALT is used on PBAs equipped with Motorola microprocessors. The main disadvantage of SALT is that it is difficult to manage revision control and PBA flow in a manufacturing environment.

The MSI bus is implemented on PBAs that utilize an INTEL MCS51 type controller. This controller requires a predefined test to be coded into firmware. It is usually the first code to be deleted when additional customer features are required to fit within a given non-volatile memory area. Since the bulk of the provisioning required is internal to an ASIC, it was decided that putting the provisioning channel in the ASIC would work for the largest variety of PBAs.

PBA Resident Functional Tests

Digital PBA's when combined with BIST (See, J. A. Floyd, M. P. Perry "Real-Time On-Board Bus Testing", 13th IEEE VLSI Test Symposium, April-May 1995), could be functionally tested rather easily, obtaining a product flow equal to analog PBA's. Adding a functional test via a collateral test, according to the invention, provides superior coverage to the digital PBA test flow currently employed. It also provides a low cost environment to do troubleshooting. The low cost troubleshooting environment did not exist prior to implementation of Collateral Test.

Fault Insertion Tests

A Fault Insertion Test is currently performed by System software developers. The previous method of fault insertion involved heavy physical modification of a given PBA to allow hardware faults to be inserted. Software would then run their programs to verify that a given fault could be detected. These modifications would have to be repeated for each new issue of PBA released. Since the modifications took approximately 1 week per PBA, regression testing was rarely performed. By incorporating the fault insertion registers, in the ASIC's, and accessing them through the Collateral Test of the invention the fault insertion is permanently available yet noninvasive to normal functionality or manufacturability. Boards modified for fault insertion in the prior art must be scrapped. The present invention permits the boards to be used normally after the test.

Standardization Implied by Collateral Asic Test Method

The Collateral Test method chosen for implementation, effectively sits on top of the 1149.X standard and allows for customized tests.

The Collateral Test is implemented with a low speed serial port which grants access to all the internal registers for both read and write functions. The use of the same implementation of the Collateral Test on all ASICs will provide a standardized hardware interface and standardized language implementation.

Price of Standardization

The cost of developing a typical functional test set presently ranges from $100,000 to $800,000. A typical test set cost $600,000. These costs are distributed as follows:

⅓ Capital cost (purchased commercial test equipment and controllers),

⅓ Software development, and

⅓ Design, build and documentations.

If the design of a single complete test set can be avoided there is an average savings of $600,000. If a new test set must be designed, the Collateral Test can save up to 25% of the software costs by re-using the Collateral Test communication software. In addition, development time is lessened. On a recent test set development effort 3 staff years were expended to develop a method of communication with an ASIC unit under test (UUT). When Collateral Test was developed, the communication development effort took less than two staff months.

On a 50,000 gate ASIC the implementation takes approximately 2% of the useable gates. An ASIC that was developed using this technique cost $50 in manufacturing quantities. 2% of this cost is $1. On a larger ASIC the percentage costs are lower.

Conclusions

Combining the ASIC test with PBA functional test (See J. C. Larrer, M. J. Martin: "Integrated Methodology for the Design of ASICs and Boards", *Electrical Communication*, Vol. 62, No. 2, ALCATEL January 1992), through the Test Access Port will require changes in PBA manufacturing test strategy. This will provide test standardization and simplification. It will also have an impact on troubleshooting methodology and total manufacturing cost reduction.

Proceeding with the technique described will also require a modification to the ASIC design and development process. Implementation of this method will produce an increase in the number of ASIC gates, however, the additional costs incurred will be offset by the savings realized during test development and implementation. It should also be stressed that the collateral test technique should be implemented in the early stages of ASIC design.

Introduction of this technique to the design process will yield a significant reduction in the volume of rework because it will allow detection of improper functionality in the early design stages of a PBA.

DESCRIPTION OF THE PREFERRED EMBODIMENT

Figure 3:
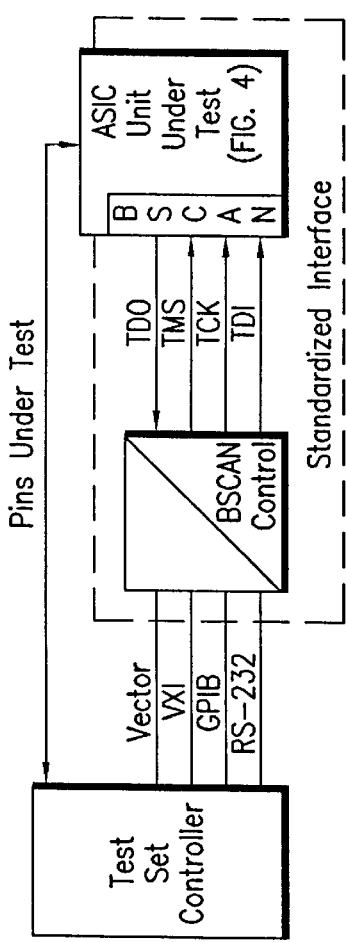
FIG. 3 shows a standardized test interface according to the prior art.
Figure 1:
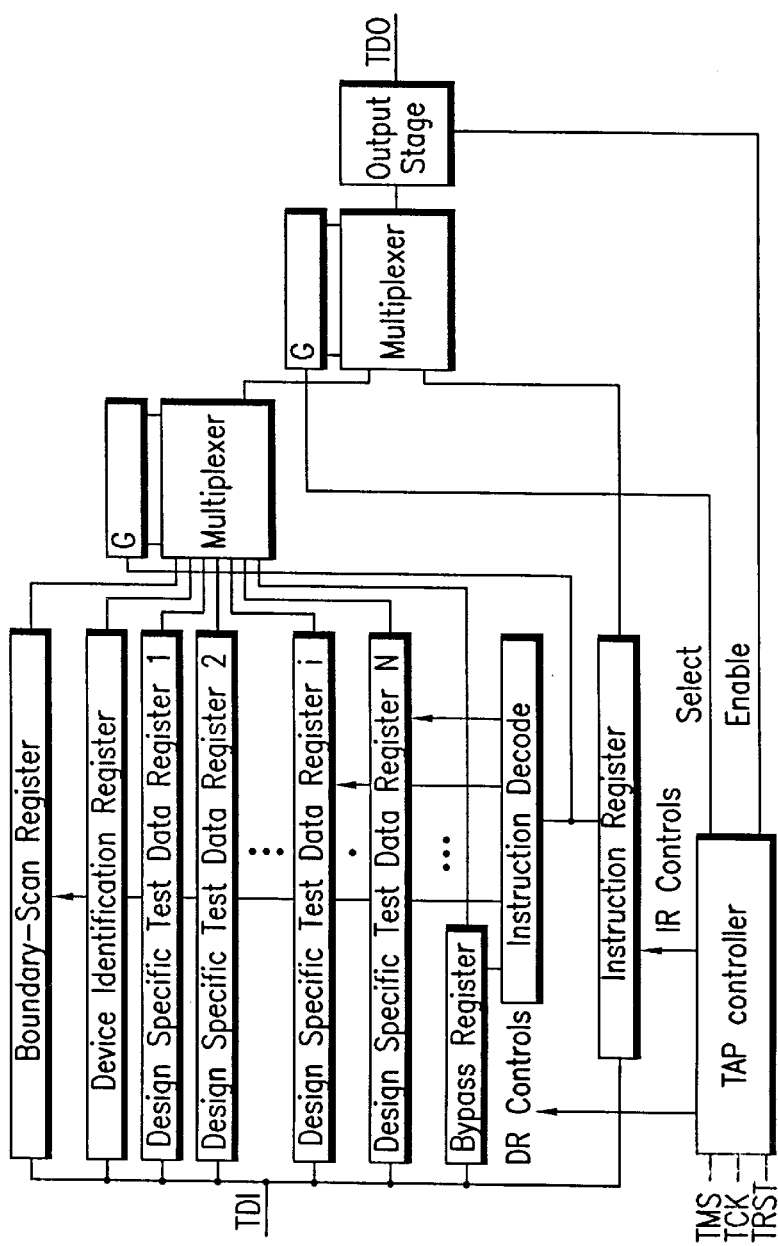
FIG. 1 is a simplified block diagram of the IEEE Standard 1149.1a-1993 boundary scan architecture with design-specific test data registers being optional.
Figure 4:
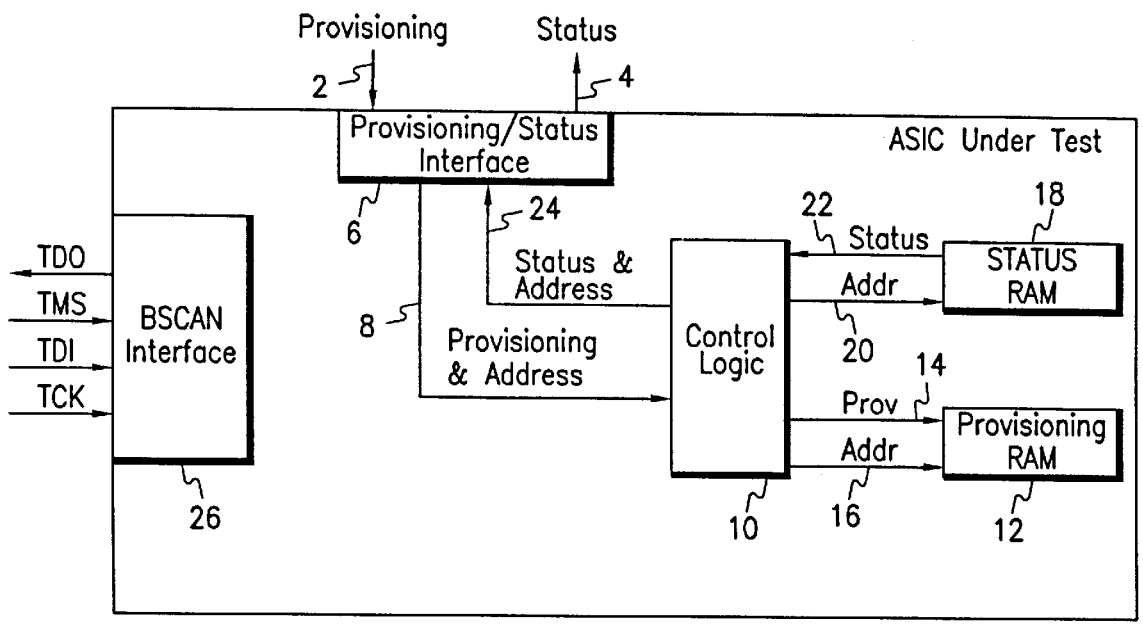
FIG. 4 shows the ASIC unit under test (UUT) of FIG. 3 in more detail, according to the prior art.

FIG. 4 shows the prior art ASIC of FIG. 3 under test in more detail, according to the prior art. There, provisioning information is inserted into the ASIC by way of a provisioning link 2 which interfaces with the ASIC in a way similar to the way in which it would be interfaced with another ASIC or device in a real environment. Status information can be read out on a line 4. The provisioning and status lines 2, 4 of FIG. 4 are merely two lines out of many indicated by a single line captioned "Pins Under Test" in FIG. 3. A provisioning/status interface 6 provides provisioning and address signals on a line 8 to a control logic block 10 which in turn provides provisioning data on a line 14 according to an address on a line 16 to the provisioning RAM 12 to affect the configuration of the ASIC in a desired manner, i.e., for test purposes. A status RAM 18 responds to address signals on a line 20 provided periodically from the control logic 10 by providing status information on a line 22 which is in turn provided on a line 24 through the provisioning/status interface 6 on the line 4. A BSCAN interface 26 is merely resident at the boundary of the ASIC under test in accordance with the BSCAN standard mentioned above. As mentioned above in connection with FIG. 3, the design of a test set controller for provisioning the ASIC under test involves creating hardware and software interfaces within the test set controller that are appropriate for interfacing with the provisioning interface of the particular ASIC under test such as shown in FIG. 4. This can be quite expensive.

Figure 5:
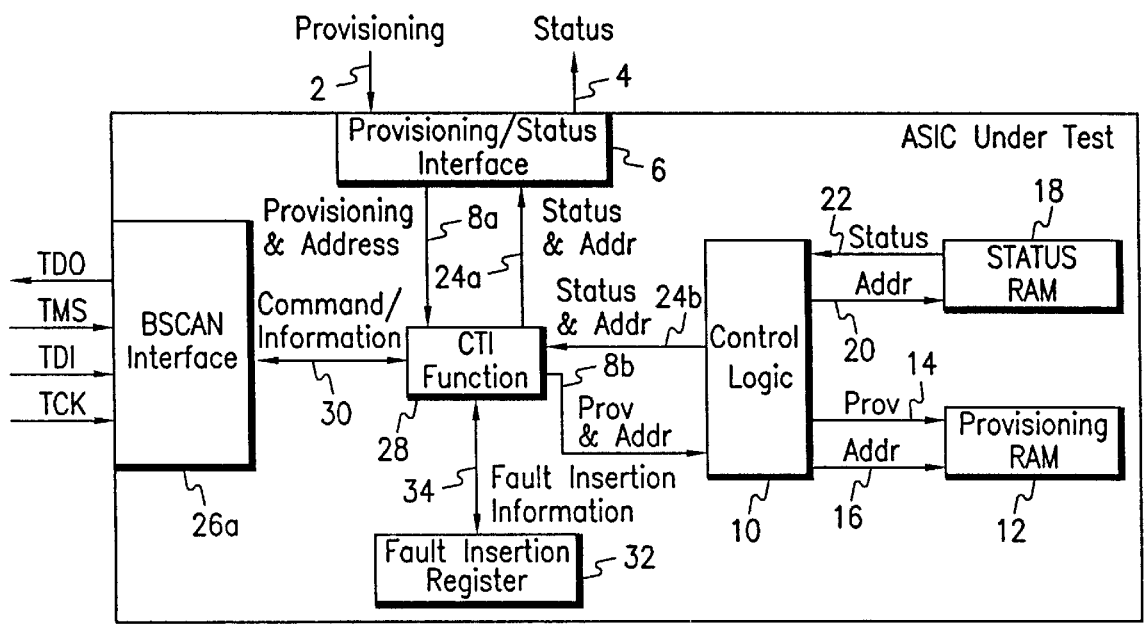
FIG. 5 shows the design of an ASIC, according to the present invention, having additional hardware added thereto in order to carry out the ASIC collateral test interface method of the present invention.

According to the present invention, at least one of three basic functions are required by the Collateral Test Interface (CTI) for it to succeed; namely the writing of configuration (provisioning) registers, the reading of status registers or the insertion of a fault. As shown in FIG. 5, according to the present invention, the internal logic of the ASIC itself is augmented in the design stage to allow access to the provisioning and status RAM by the BSCAN interface rather than the provisioning interface via logic for carrying out a CTI function.

As can be seen in FIG. 5, the same provisioning/status interface 6 is still present as well as the control logic 10, status RAM 18 and provisioning RAM 12. A Collateral Test Interface (CTI) functional block 28, however, is provided as well and is designed internal to the ASIC from the outset. It is interconnected to the provisioning/status interface 6 and the control logic 10 by provisioning and address lines 8a, 8b and status and address lines 24a, 24b. Unlike the BSCAN interface 26 of FIG. 4, a BSCAN interface 26a of FIG. 5 is interconnected to the CTI functional block 28 by a command/information line 30 for communicating command and/or information signals therebetween. A fault insertion register 32 is also connected to the CTI functional block 28 by means of a fault insertion information signal line 34.

As can be appreciated from FIG. 3 and the teachings of FIG. 5, according to the present invention, the test set controller of FIG. 3 need not include an expensive provisioning interface of its own, for accessing the interface 6, and this information can instead be accessed exclusively through the familiar BSCAN interface. As suggested, added logic to the ASIC is needed to accomplish the CTI function and an additional fault insertion RAM may also be included as described in more detail below.

Provisioning data is information stored by the ASIC device which is used to configure its mode of operation. For a particular telecommunications application, the normal (prior art) (provisioning) interface of FIG. 4 is a Time Division Multiplexed (TDM) port which allows one write every 125 µsec to any one of 32 possible configuration registers inside the ASIC. This port is shared by 16 like devices, each having a TDM timeslot, addressable via pins on the device. System clocks and specifically aligned sync signals are required to make this interface work properly. This interface normally runs at rate of 6.912 MHz, which translates to 864 clock cycles per 125 µsec window. The overhead to test the device, cost and fixture design time, becomes too great to justify. To allow a test group to access these internal registers without the use of this normal, restrictive interface would greatly enhance the speed of test as well as simplify the test fixture required.

Figure 6:
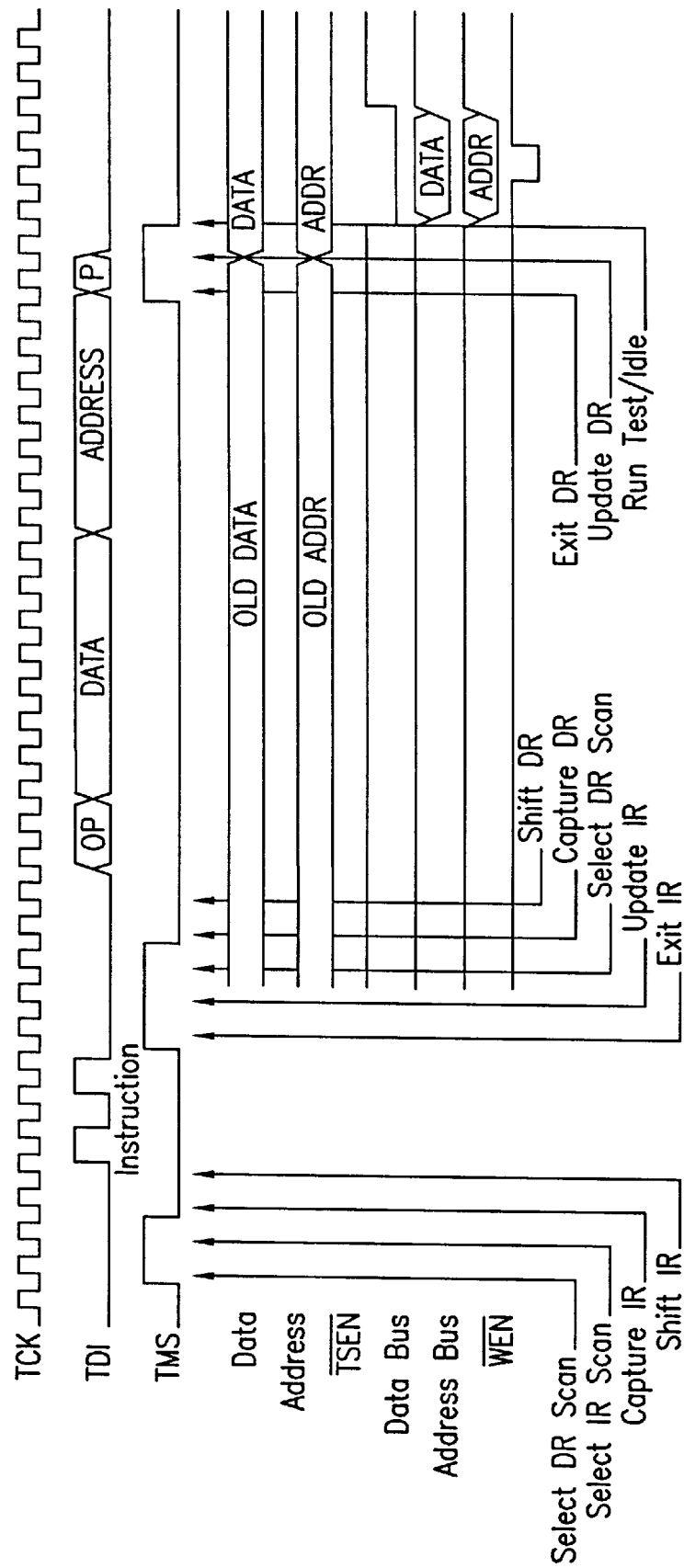
FIG. 6 shows a timing diagram for the provisioning-register write function of a CTI of a BSCAN ASIC such as shown in FIG. 7.
Figure 7:
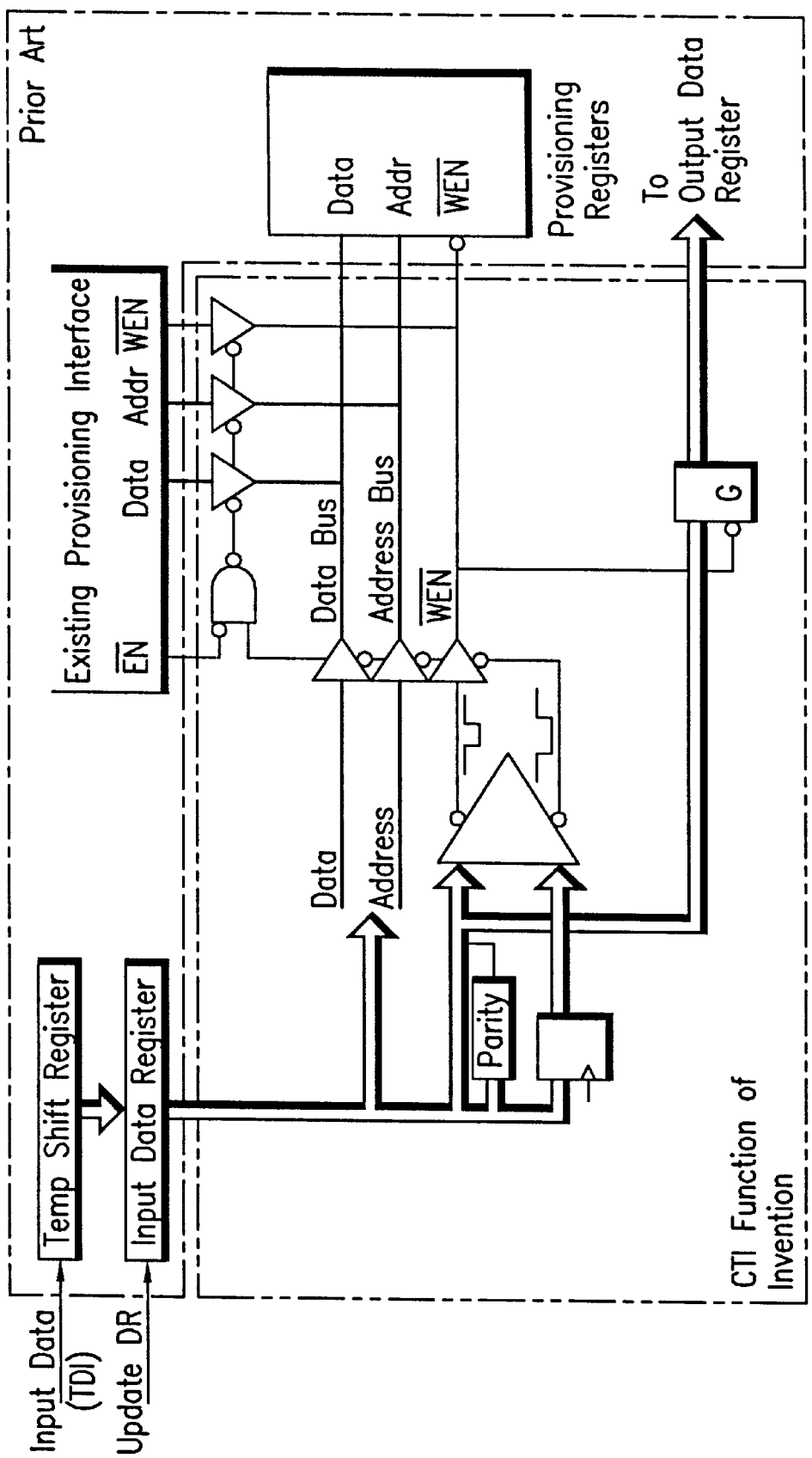
FIG. 7 shows a CTI block diagram for the provisioning-write function of a BSCAN ASIC.

According to the present invention as shown in more detail in FIGS. 6 and 7, an instruction is written to the BSCAN instruction register in order to tell the ASIC that the subsequent data received shall be latched into the data register for provisioning the ASIC. The provisioning data and address, along with a 2 bit operation identifier, is shifted into the Input Data Register. As shown in FIG. 7, once the data in the Input Data Register has been updated by passing the BSCAN through the Update DR state of FIG. 2, the Collateral Test Interface (CTI) takes over. The CTI detects a change in the register by comparing it to its previous value. If a change is detected, the Input Register data is checked for proper parity (odd) and OPCODE. If parity is correct and the OPCODE is that for a provisioning write, the address field found in the Input Data Register is applied to the address inputs of the provisioning register, while, at the same time, provisioning information from the data field is applied on the 8 bit provisioning input bus. The tri-state enable ($\overline{TSEN}$) is activated to apply these to the provisioning registers, While inhibiting the existing provisioning interface from gaining access to those registers during this time. A write pulse ($\overline{WEN}$) is then asserted to effect the write. $\overline{WEN}$ is structured as to allow more than adequate setup and hold for all address and data lines.

FIG. 6 illustrates the timing associated with this function. The total number of clock cycles required to complete this write cycle, using the CTI, is approximately 40 clock cycles, as opposed to the 864 clock cycles required by the existing interface described above. Thus test throughput is increased by a magnitude of 20×.

Figure 2:
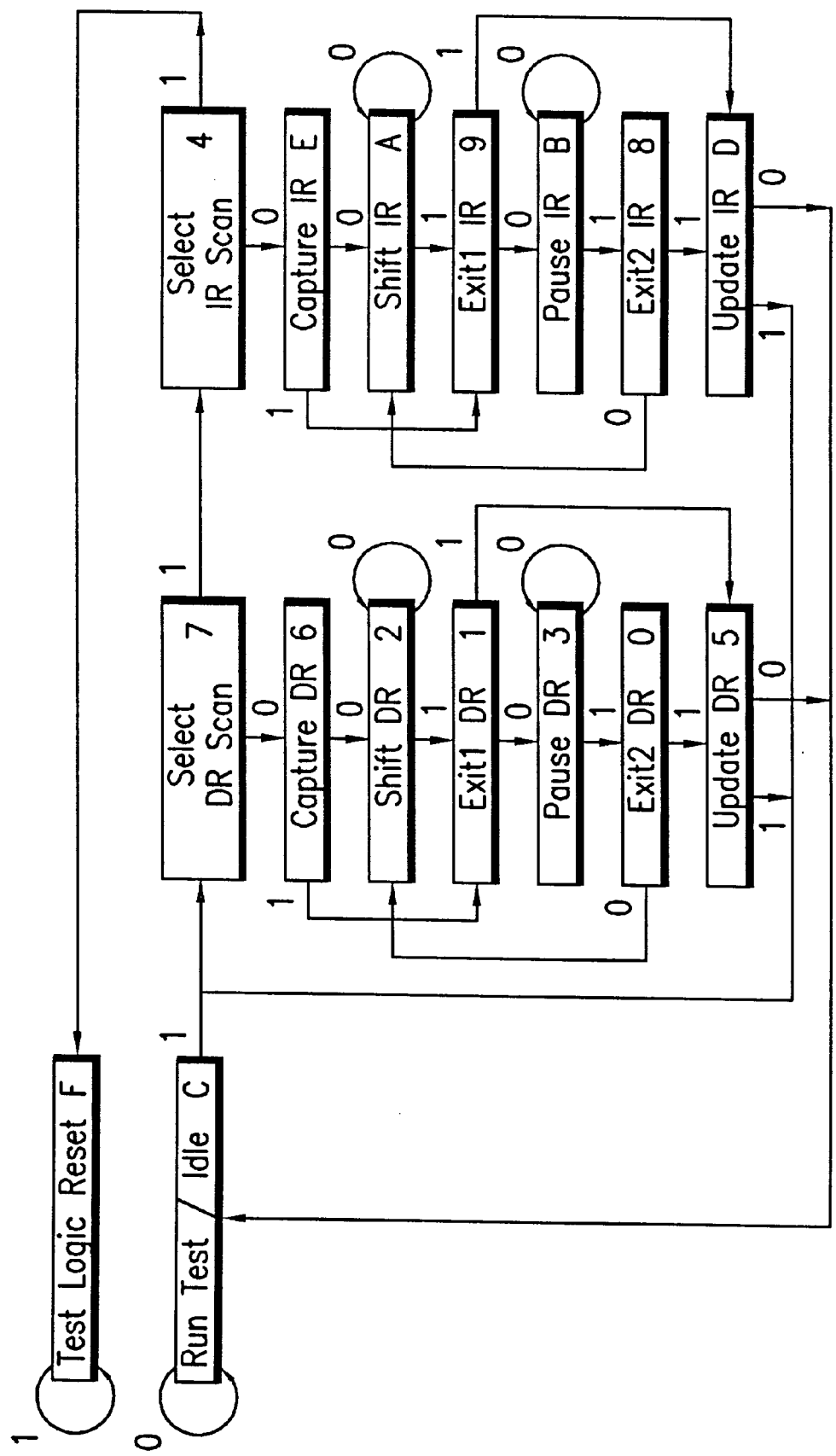
FIG. 2 shows the IEEE-defined boundary scan state machine with values shown next to each state transition representing the signal present at the TMS input during a rising edge of TCK and the hexi-decimal numbers within the boxes to the right representing the machine state.

Successful completion of this operation can be verified by reading the Output Data Register. $\overline{WEN}$ also latches the data, address, and parity information for capture by the Output Data Register for readback purposes. This is accomplished by shifting through the state machine of. FIG. 2 and writing the Instruction Register to allow this Data Register to be muxed to the TDO output. When the BSCAN circuitry passes through the CAPTURE DR state, the previously executed provisioning write data is loaded into the Output Data Register from the latch. The TMS line is then toggled further to arrive at the SHIFT DR state, where 16 clock cycles are applied to shift the data in this register out onto the TDO line.

As mentioned above, the present invention can be used to read STATUS information contained in the ASIC. Like the provisioning information discussed above, it is configured internally as a memory mapped structure. As a result, one needs to simply supply an address in order to retrieve specific information regarding the configuration or error conditions detected by the ASIC.

Figure 8:
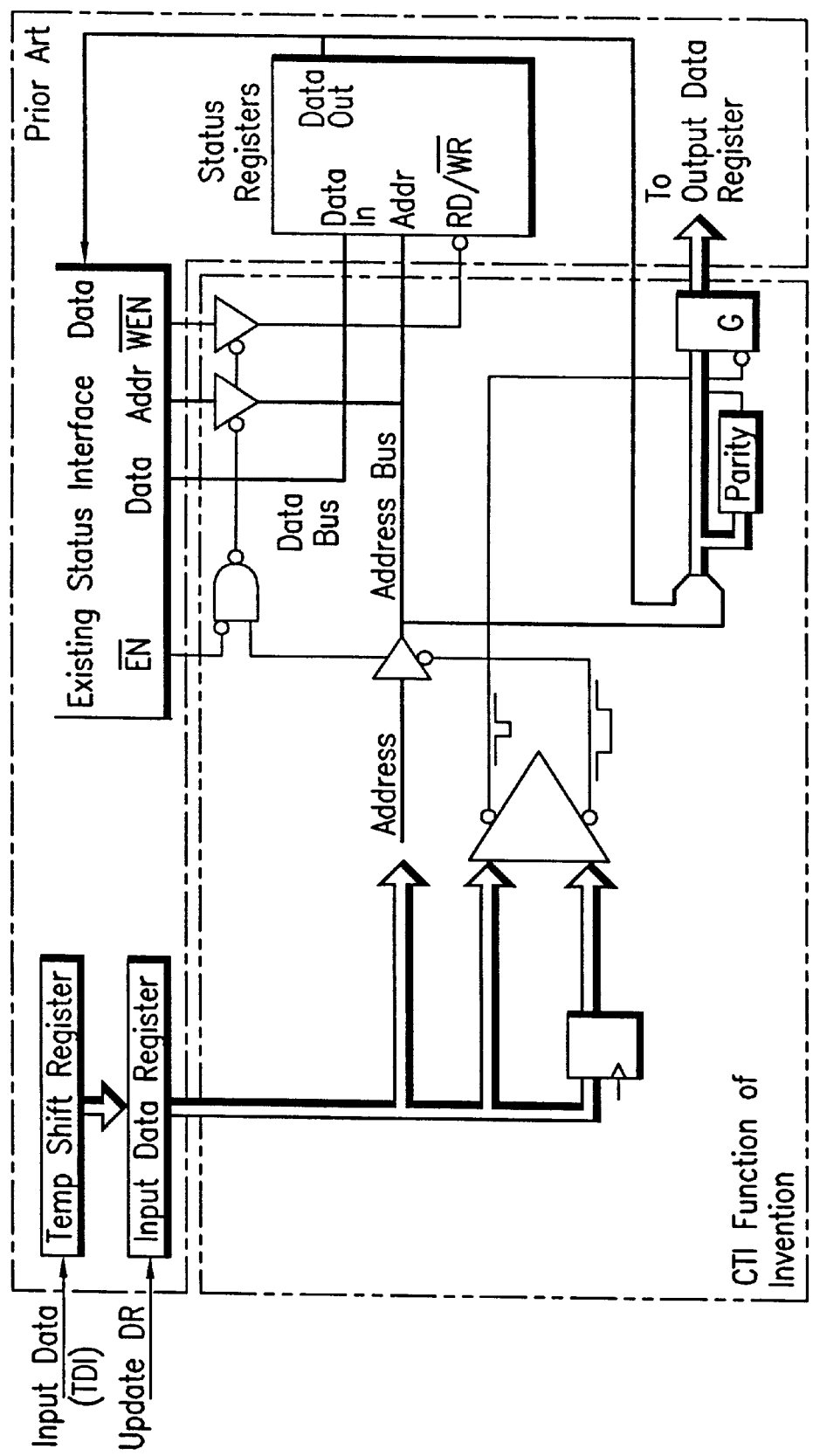
FIG. 8 shows a CTI block diagram for the status read function of a BSCAN ASIC.

As shown in FIG. 8, reading of selected STATUS registers is performed in a very similar fashion to that of writing provisioning. An instruction is written to the instruction register in order to tell the ASIC that the subsequent data received shall be latched into the Input Data Register. This data shall contain the address for the memory mapped STATUS to be read from the ASIC. The TMS line is then toggled further to arrive at the SHIFT DR state, where the address and OP Code information is shifted into the Data Register, as in FIG. 8. Data associated with that address is then accessed and written into the Data Output Register along with the requesting address. The TMS is toggled again to shift through the state machine in order that the Instruction Register may be accessed to allow this Data Register to be muxed to the TDO output.

Figure 9:
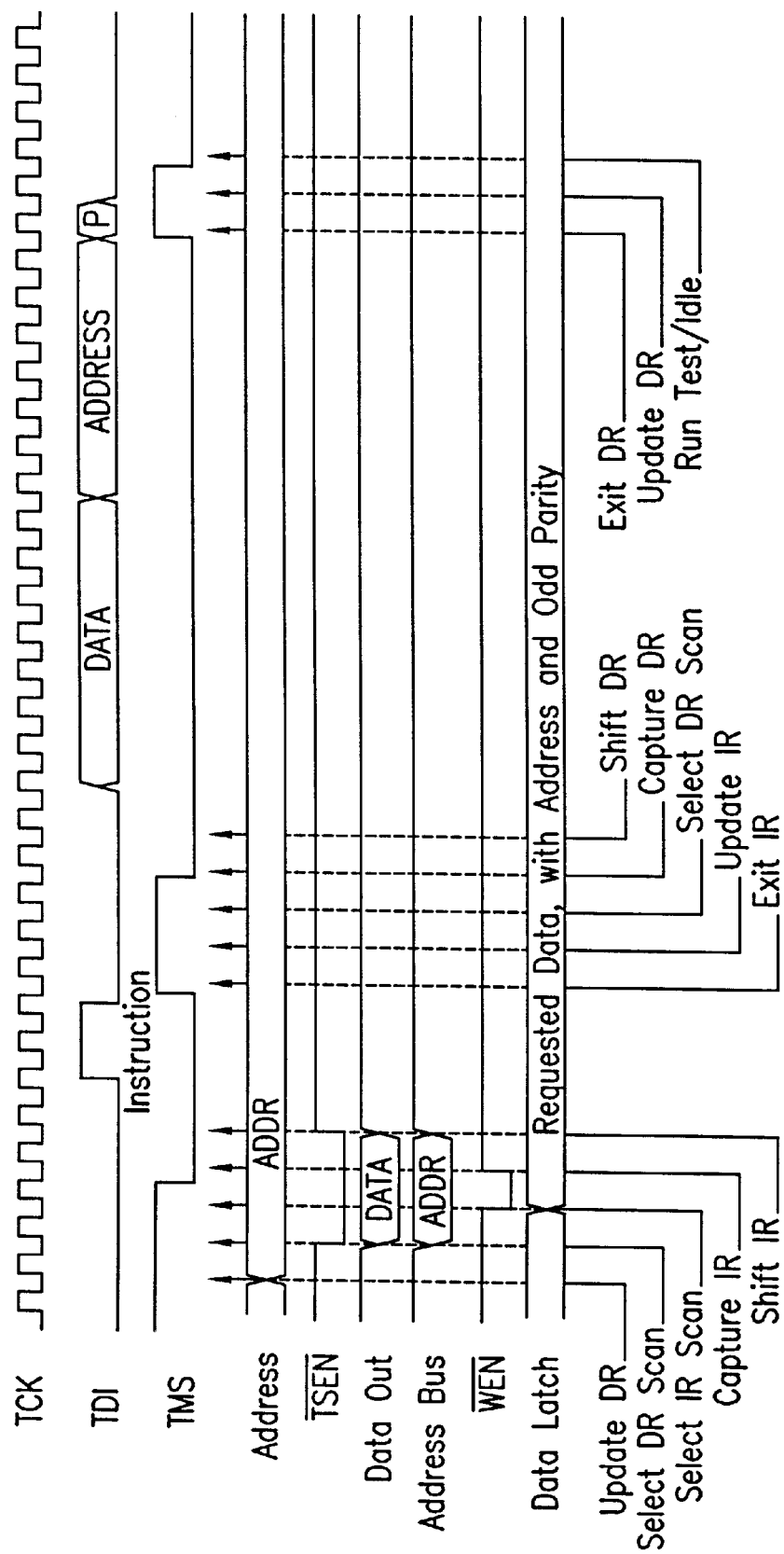
FIG. 9 shows a timing diagram for a status register read cycle.
Figure 10:
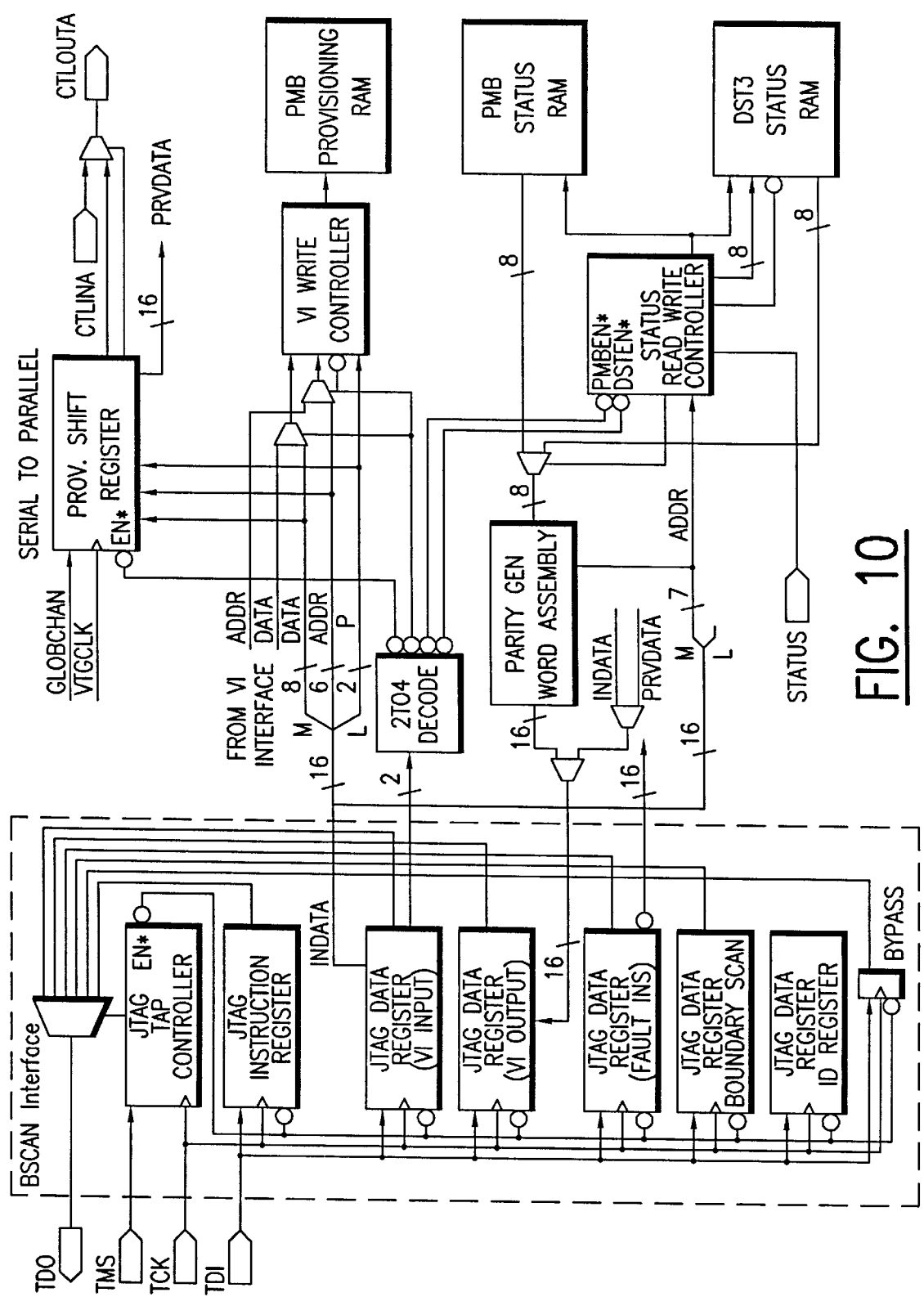
FIG. 10 shows a collateral test implementation in a boundary scan device where PMB indicates the BSCAN device and DST3 is the non-BSCAN part of the ASIC.

Thus, FIGS. 8 and 9 illustrate how data is retrieved from the Status Registers. The Update DR State of FIG. 2 loads the status address into the Input Data Register. An edge detection is performed on the change in this data from its previous value, which initiates the reading of the status register. The tri-state buffers of the CTI are enabled by $\overline{TSEN}$, at the same time disabling those from the existing status interface to prevent contention. RD/$\overline{WR}$ is therefore held high by the internal pull-up on this line, so the address on Addr will effect a read of the register. $\overline{WEN}$ latches this data, along with address and odd parity, for capture by the Output Data Register upon arrival in the Capture DR State. The TMS line takes the circuitry through the state machine to the SHIFT DR state, where clock cycles are applied to shift the data out of this register. The state machine is then parked in the RUN TEST/IDLE state of FIG. 2, FIG. 10 illustrates actual implementation in an ASIC. The circuitry is designed to interface as seamlessly as possible with the normal provisioning and status interface. A modified BSCAN Interface consists primarily of a grouping of Input and Output Data Registers, all of which are accessible for writing via TDI and reading via TDO. Decoding of the OP Codes controls the MUXes and control lines which aid in the transfer of data and address information. If provisioning of an external ASIC is desired, the information is loaded into a P/S shift register for transmission at the appropriate time. If provisioning is to take place internally, information is loaded from the Input Data Registers to the Write Controller, and Provisioning RAM is updated at the appropriate time. status Reads apply the address found in the Input Data Register to the Status RAM defined by the OPCODE. Associated with this operation is returned STATUS information, along with its associated address and parity, which is assembled and loaded into the Output Data Register for reading.

Figure 11:
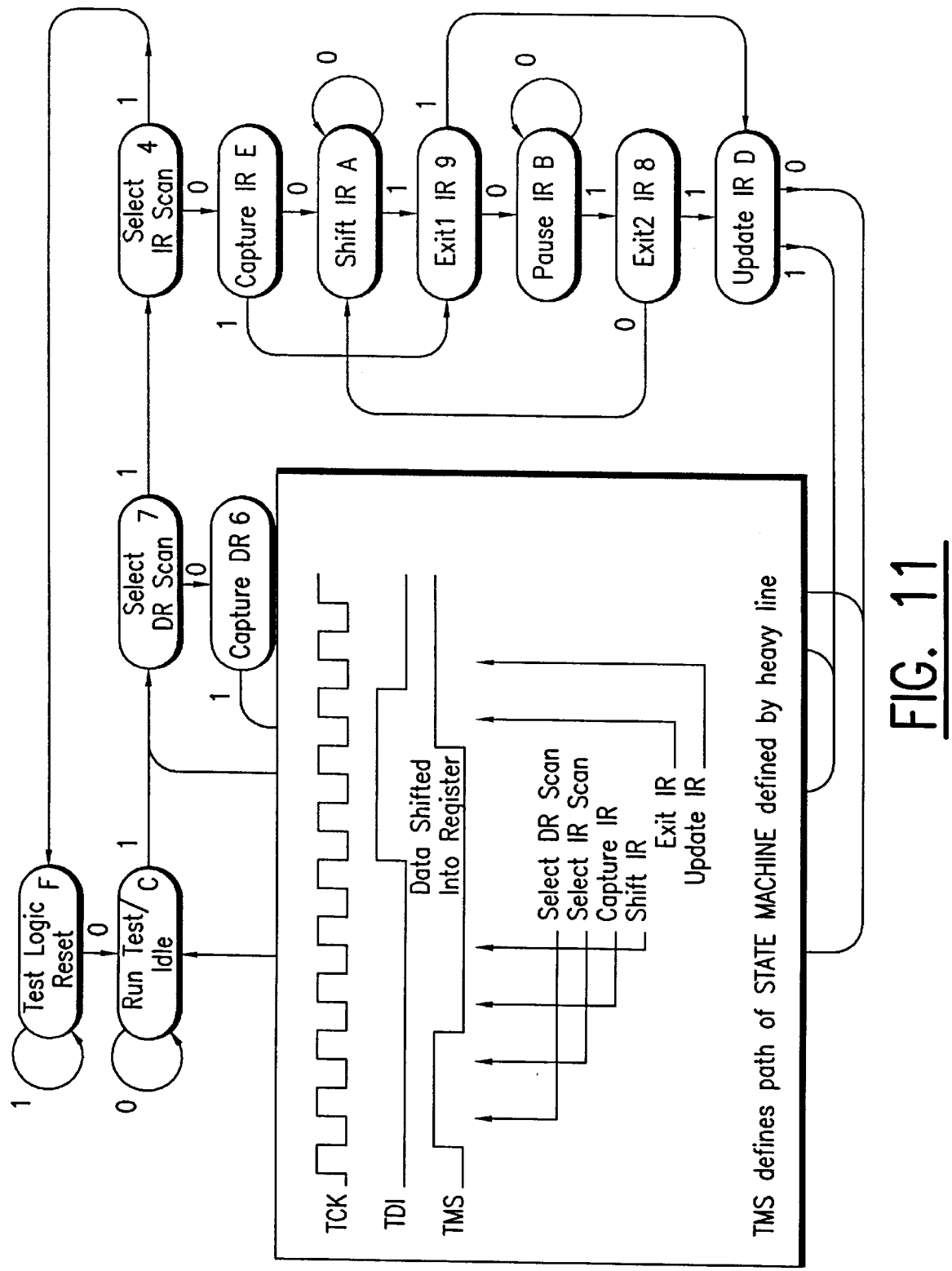
FIG. 11 illustrates an instruction register write cycle for fault insertion, according to the present invention.
Figure 12:
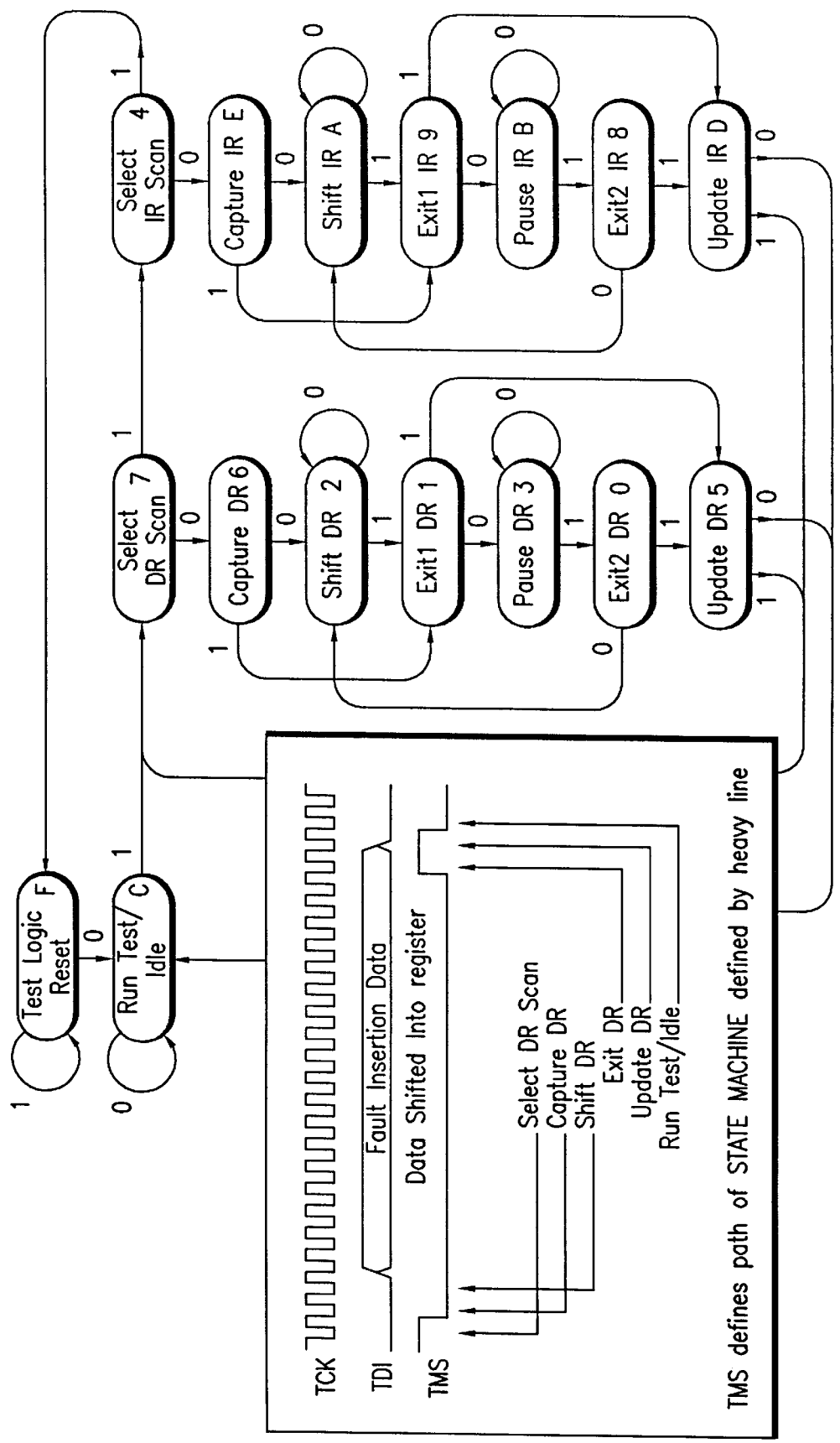
FIG. 12 shows a data register write cycle for fault insertion, according to the present invention.

FIGS. 11 and 12 illustrate use of the BSCAN interface to access a fault insertion module such as shown in FIG. 5. In the past, faults have had to be inserted manually, often by the physically destructive cutting of tracks or lifting of pins to achieve fault insertion. This process is labor intensive and can produce an unstable end product. This also limits the number of test modules delivered. According to the invention, the BSCAN interface can be used to access a user defined register that can be written to in order to enable defined faults that are designed into modules to be manifested without harm.

As suggested above, the present invention makes use of the private or design specific registers identified in IEEE 1149.1 in order to inject information into a device. Making use of one of these registers also requires the formation of a user-specific instruction. Once defined, access of this instruction permits the writing of a serial to parallel shift register. This register can contain bits of information (e.g., 1 bit per fault) which may be used to control circuitry to inject these faults. Faults are usually mutually exclusive, but this approach does not limit one to injecting a single fault. Faults can either be generated internal to the device containing this interface (ASIC FPGA) or brought out to pins on the device in order to create external faults at the board level. These faults can be controlled via software from a terminal, rather than through manual intervention. This automation of the process accelerates this stage of development.

Thus, according to the faults insertion aspect of the present invention, as shown in FIG. 11, an instruction is written to the instruction register in order to tell the ASIC that the proceeding 19 bit serial data word input on TDI is for the fault insertion register of the ASIC. This is accomplished by driving the TMS input to particular states defined in FIG. 11 in order that the circuitry may move through the state machine. Assuming the circuitry was parked in the run test/idle state, in order to write the instruction to load the fault insertion register (instruction 7), the waveform in FIG. 11 would need to be applied to the device.

With the updating of the instruction register, the path to write the fault insertion register is opened. The TMS line is then further toggled to steer the circuitry through the state machine in order to shift the fault insertion command into the fault insertion register, shown in FIG. 12. With the updating of this data register, fault insertion information is automatically applied to the FI circuitry in the ASIC or externally on the board.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. An application specific integrated circuit (ASIC) including a standard boundary scan (BSCAN) interface (26) further comprising a collateral test interface (28) connected to said BSCAN interface by a signal line (30) for exchanging information and connected to a memory device for storing information therein or for retrieving information therefrom.

2. The ASIC of claim 1, wherein said memory device comprises a fault insertion register (32) connected to said collateral test interface by a fault insertion information signal line (34).

3. The ASIC of claim 2, wherein said memory device further comprises a status memory (18) connected to said collateral test interface via control logic (10).

4. The ASIC of claim 2, wherein said memory device further comprises a provisioning memory (12) connected to said collateral test interface via control logic (10).

5. The ASIC of claim 4, wherein said memory device further comprises a status memory (18) connected to said collateral test interface via said control logic (10).

6. The ASIC of claim 1, wherein said memory device comprises a status memory (18) connected to said collateral test interface via control logic (10).

7. The ASIC of claim 6, wherein said memory device further comprises a provisioning memory (12) connected to said collateral test interface via control logic (10).

8. The ASIC of claim 1, wherein said memory device comprises a provisioning memory (12) connected to said collateral test interface via control logic (10).

9. An application specific integrated circuit (ASIC) including a standard boundary scan (BSCAN) interface (26), a provisioning/status interface (6) and a control logic (10) for storing functional provisioning data and/or for retrieving functional status data, said ASIC comprising a collateral test interface (28) connecting to said control logic, said provisioning/status interface and said BSCAN interface, characterized in that said collateral test interface provides alternative connection for said control logic to:

(i) said provisioning/status interface for normal usage; and (ii) said BSCAN interface for testing usage so as to store said provisioning data and/or to retrieve said stored status data, without otherwise impeding the normal usage of said ASIC.

10. The ASIC of claim 9 further comprising a fault insertion register (32) to communicate with said BSCAN interface for storing fault insertion data therefrom.

11. Method for testing a subsystem containing an application specific integrated circuit (ASIC) that includes a standard boundary scan (BSCAN) interface (26), a provisioning/status interface (6) and control logic (10) for storing functional provisioning data and/or for retrieving functional status data, characterized by the alternative steps of:

(i) connecting said control logic to said provisioning/status interface for normal usage, and (ii) connecting said control logic to said standard BSCAN interface for testing usage so as to store said provisioning data and/or to retrieve said stored status data, without otherwise impeding the normal usage of said ASIC.

12. The method of claim 11, further characterized by connecting said BSCAN interface to a fault insertion register for storing fault insertion data therefrom.

* * * * *